United States Patent [19]

Gelatos et al.

[11] Patent Number: 5,391,517
[45] Date of Patent: Feb. 21, 1995

[54] PROCESS FOR FORMING COPPER INTERCONNECT STRUCTURE

[75] Inventors: Avgerinos V. Gelatos; Robert W. Fiordalice, both of Austin, Tex.

[73] Assignee: Motorola Inc., Schaumburg, Ill.

[21] Appl. No.: 120,097

[22] Filed: Sep. 13, 1993

[51] Int. Cl.[6] .............................................. H01L 21/44
[52] U.S. Cl. ..................................... 437/190; 437/192
[58] Field of Search ................ 437/190, 189, 192, 198

[56] References Cited

U.S. PATENT DOCUMENTS

| | | | |
|---|---|---|---|
| 4,910,169 | 3/1990 | Hoshino | 437/198 |
| 5,019,531 | 5/1991 | Awaya et al. | 437/180 |
| 5,164,332 | 11/1992 | Kumar | 437/198 |
| 5,240,880 | 8/1993 | Hindman et al. | 437/190 |

FOREIGN PATENT DOCUMENTS 4028233  1/1992  Japan .................................... 437/198

OTHER PUBLICATIONS

T. Maeda, et al. "Effects of Ti Interlevel Existence in Al/Ti/TiN/Ti Structure" 1985 Symp. on VLSI Tech. (1985) (Month Unknown) pp. 50–51.
J. O. Olowalafe et al. "Interdiffusion in Cu/reactive ion-sputtered TiN . . . " J. Appl. Phys. 72(9) Nov. 1992 pp. 4099–4103.
Alain E. Kaloyeros, et al. "Chem. Vap. Deposition of Copper for Multilevel Metallization" MRS Bull. Jun. 1993 pp. 22–29.
Yoshimoto, et al. "Films of the Intermetallic Compound $CuTi_2$ and their Applications" Elec. and Comm. in Japan II vol. 76, No. 2 (Feb. 1993) pp. 93–100 abstract.

*Primary Examiner*—Olik Chaudhuri
*Assistant Examiner*—C. Everhart
*Attorney, Agent, or Firm*—Jasper W. Dockrey

[57] ABSTRACT

A copper metallization structure and process for the formation of electrical interconnections fabricated with pure copper metal is provided. The metallization structure includes an interface layer (22) intermediate to a dielectric layer (12), and a copper interconnect (30). The interface layer (22) functions to adhere the copper interconnect (30) to a device substrate (10) and to prevent the diffusion of copper into underlying dielectric layers. The interconnect layer (22) is fabricated by depositing a first titanium layer (16) followed by the sequential deposition of a titanium nitride layer (18), and a second titanium layer (20). A copper layer (24) is deposited to overlie the second titanium layer (20) and an annealing step is carried out to form a copper-titanium intermetallic layer (26). The titanium nitride layer (18) functions as a diffusion barrier preventing the diffusion of copper into the underlying dielectric layer (12), and the copper titanium intermetallic layer (26) provides an adhesive material, which adheres the copper layer (24) to the device substrate (10). Following the formation of the intermetallic layer (26), the device surface is planarized to form a planar surface (28), and to form an inlaid copper interconnect (30).

15 Claims, 2 Drawing Sheets

1

PROCESS FOR FORMING COPPER INTERCONNECT STRUCTURE

FIELD OF THE INVENTION

This invention relates in general to a metallization structure in a semiconductor device and to a method for fabricating the structure, and more particularly to a copper interconnect structure in a semiconductor device.

BACKGROUND OF THE INVENTION

As the demand for high performance integrated circuit devices continues to increase, designers have reduced circuit geometries in order to obtain improved performance. As the gate lengths of MOS transistors shrink to sub-half-micron dimensions, the switching speed of the transistors increases dramatically. To take full advantage of the increased speed of the transistors, electrical interconnect structures having high electrical conductivity must also be provided. The performance of advanced integrated circuit devices is often limited by the electrical conductivity of metal interconnects, which electrically couple the various device components of an integrated circuit.

In the past, aluminum, and its alloys, have been widely used for metal interconnect structures. However, as device geometries continue to be reduced, the number of devices which must be electrically interconnected has increased. The increased number of electrical interconnections required for advanced integrated circuit designs necessitates the formation of extremely narrow interconnect leads. The utilization of aluminum and its alloys for high density interconnect formation is limited by the tendency of aluminum to undergo thermally induced voiding and electromigration. An additional problem associated with aluminum metallurgy is the relatively higher electrical resistance of aluminum alloys as compared to other electrically conductive metals.

To overcome the limitations associated with the use of aluminum for electrical interconnects, other metals, such as copper, gold, and silver have been proposed as a substitute for aluminum and its alloys. Copper offers a desirable alternative to aluminum, because of its low resistivity and resistance to electromigration. However, copper diffuses readily in materials commonly used in integrated circuit fabrication, such as silicon and silicon dioxide. Additionally, copper does not adhere well to many other metals nor to insulators such as silicon dioxide and silicon nitride. The aforementioned characteristics of copper prevent the relatively straight forward formation of copper leads in a manner analogous to that used in the formation of aluminum interconnects. Therefore, the implementation of copper for the formation of electrical interconnects requires that special processes and materials be provided to overcome the problems of diffusion and adhesion associated with the use of copper.

SUMMARY OF THE INVENTION

In practicing the present invention there is provided a copper interconnect structure and process, which enables the formation of a high-reliability copper interconnect. To facilitate the use of a copper interconnect in a wide variety of device configurations, an interface layer is provided which improves the adhesion of the copper interconnect to underlying dielectric materials. The interface layer also prevents the diffusion of copper into underlying dielectric layers and device components. In one embodiment, a device substrate is provided having a dielectric layer thereon. An interface layer is formed to overlie the dielectric layer. The interface layer includes at least a titanium nitride layer and a titanium layer. A copper layer is then formed overlying and in intimate contact with the interface layer. Finally, the structure is annealed to form a copper-titanium intermetallic layer between the copper layer and the interface layer. The combination of metals present in the interface layer results in an interface layer which adheres the copper interconnect to the substrate, and prevents diffusion of copper into underlying layers.

Figure 1:
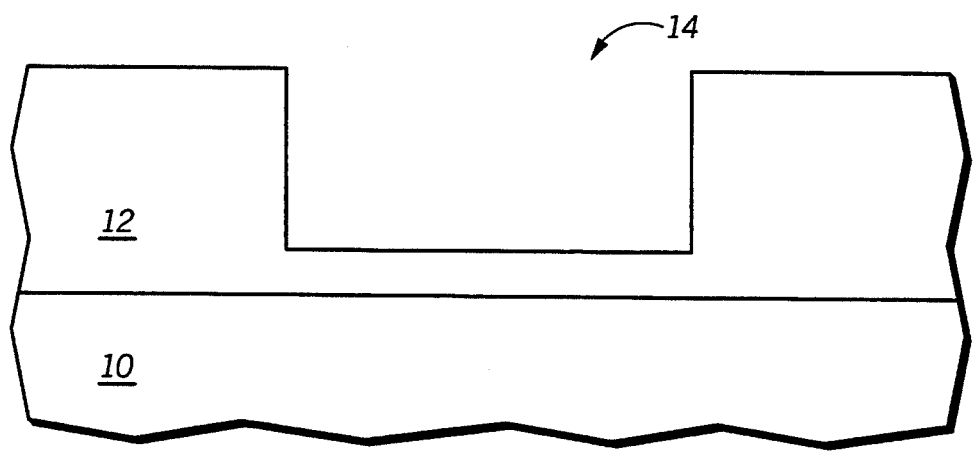
FIGS. 1–5 illustrate, in cross-section, process steps in accordance with one embodiment of the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE PREFERRED EMBODIMENTS

The metallization structure of the invention provides an improved copper interconnect structure in which diffusion of copper into underlying device layers is prevented. In addition, the metallization structure provides improved adhesion of copper to a device substrate. The improved metallization structure of the present invention enables copper interconnects to be reliably formed for electrically coupling integrated circuit device components. Using the metallization structure of the present invention, the advantages of copper interconnect metallurgy can be fully realized in a variety of integrated circuit applications.

FIGS. 1–5 illustrate, in cross-section, process steps for the fabrication of a copper interconnect structure in accordance with one embodiment of the invention. The figures illustrate the formation of an inlaid copper interconnect in a dielectric body. The dielectric body is depicted to overlie a device substrate 10. Although not shown in FIGS. 1–5, those skilled in the art will appreciate that device substrate 10 will typically contain a large number of electrically coupled device components. The electrically coupled components can include MOS transistors, resistors, logic devices, and the like. Further, device substrate 10 can contain bipolar transistors in addition to MOS transistors. In addition, substrate 10 can include metal interconnect layers overlying other device components and electrically coupled to those device components. The present invention also contemplates that device substrate 10 can be a portion of a standard logic device, or hybrid device. Furthermore, device substrate 10 can be a portion of an integrated circuit package, and the process illustrated can be associated with the formation of package interconnections. Thus, all such conventional integrated circuit devices and discrete component devices, can be present in device substrate 10, and such devices and packaging interconnections are within the scope of the present invention.

Shown in FIG. 1, in cross-section, is a portion of a semiconductor device, which includes a device substrate 10 and an overlying dielectric layer 12. As previously described, substrate 10 can include a variety of integrated circuit components already fully formed during previous fabrication steps. Dielectric layer 12 can be one of a number of different dielectric materials commonly used in integrated circuit fabrication. For example, dielectric layer 12 can be silicon dioxide, silicon nitride, or a doped glass layer, such as phosphorus silicate glass, boron silicate glass, and the like. Depending upon the particular dielectric material, dielectric layer 12 is formed by chemical vapor deposition deposited (CVD), plasma enhanced chemical vapor deposition (PECVD), or atmospheric deposition. In a preferred embodiment, dielectric layer 12 is a chemical vapor deposited material, such as silicon dioxide or silicon nitride, which has been deposited over a planarized insulating layer (not shown).

Once dielectric layer 12 has been deposited, a cavity 14 is formed in the dielectric layer. Preferably cavity 14 is formed by reactive ion etching using a photolithographic mask to define the lateral extent of the cavity. As illustrated in FIG. 1, cavity 14 does not completely extend through dielectric layer 12. Although cavity 14 is illustrated in a preferred configuration, cavity 14 can have a configuration substantially different than that illustrated in FIG. 1. For example, cavity 14 can have rounded corners, or be substantially elongated in a lateral or vertical direction.

Figure 2:
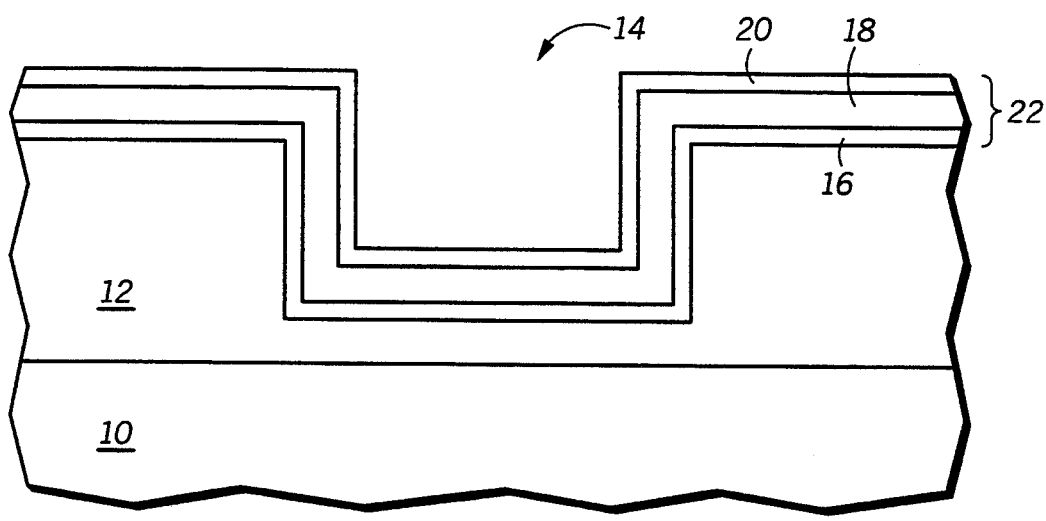

After forming cavity 14, copper interface metallurgy is formed on the surface of dielectric layer 12, and within cavity 14. As illustrated in FIG. 2, the interface metallurgy, collectively identified as interface layer 22, includes three individual metal layers.

The interface layer of the present invention includes a particular combination of metals which promote the adhesion of copper to device substrate 10, and prevent the diffusion of copper into the underlying substrate. In a preferred embodiment, a first titanium layer 16 overlies the surface of dielectric layer 12, and a titanium nitride layer 18 overlies first titanium layer 16. A second titanium layer 20 overlies titanium nitride layer 18. Specifically, titanium nitride layer 18 provides a diffusion barrier preventing the transport of copper into first titanium layer 16 and the underlying dielectric and device layers. First and second titanium layers 16 and 20, respectively, promote the adhesion of the interface layer to dielectric layer 12, and promote the adhesion of copper to the interface layer itself. In an alternative embodiment, other metals having the necessary adhesive and diffusion barrier characteristics can be employed to form interface layer 22. For example, titanium tungsten or tantalum can be used in the place of titanium nitride as a diffusion barrier. Furthermore, chrome can be used to form the uppermost metal layer of interface layer 22.

Preferably, interface layer 22 is formed in a multi-stage sputtering apparatus. In the first stage of the sputtering system, titanium is sputtered onto dielectric layer 12 to a thickness of preferably about 100–300 angstroms, and most preferably about 200 angstroms. In the second stage of the sputtering system, titanium nitride layer 18 is sputtered onto first titanium layer 16 to a thickness of preferably about 300–500 angstroms, and most preferably about 400 angstroms. Finally, in the third stage of the sputtering system, second titanium layer 20 is sputtered onto titanium nitride layer 18 preferably to a thickness of about 100–300 angstroms, and most preferably about 200 angstroms.

During the multi-stage sputtering process used to form interface layer 22, device substrate 10 is transported between the various sputtering chambers in the multi-stage system without exposing device substrate 10 to ambient atmospheric conditions. In the multi-stage sputtering system, the sputter deposition chambers and the transfer chambers are either maintained in inert atmospheric conditions by continually purging the chambers and transfer systems with an inert gas, such as argon, or nitrogen, or the like. Alternatively, the transfer system can be maintained under high-vacuum. By maintaining inert atmospheric conditions during the sputter deposition process, the formation of titanium oxide and other metallic oxide layers are prevented. The fabrication of interface layer 22 in an inert environment ensures the preservation of the adhesion and diffusion barrier characteristics of interface layer 22. In an alternative processing method, the titanium and titanium nitride layers of interface layer 22 can be formed in separate deposition apparatus. However, care must be taken to ensure that any native oxide or other metallic oxide layers, which may form on the surface of a deposited layer, are removed prior to the deposition of subsequent layers.

Figure 3:
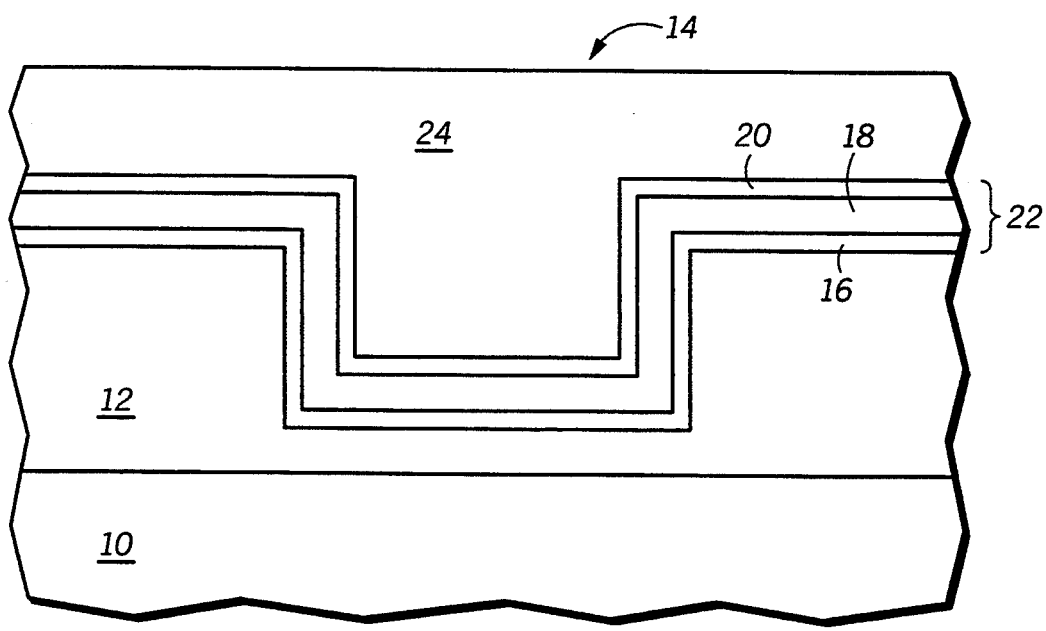

Once the fabrication of interface layer 22 is complete, a layer of copper is deposited onto interface layer 22, as illustrated in FIG. 3. Copper layer 24 is deposited to a thickness sufficient to completely fill cavity 14, and to overlie adjacent regions of interface layer 22. Preferably, copper layer 24 is deposited by metal-organic-chemical-vapor-deposition (MOCVD). The MOCVD process is carried out using metal-organic precursors of copper (I) and copper (II).

The metal-organic copper precursors are complex molecules in which organic ligands are bonded to copper through by an oxygen atom in the ligand. One family of metal-organic copper precursors for MOCVD copper deposition includes copper (II) $\beta$-diketonate compounds. The copper $\beta$-diketonate compounds are highly volatile and yield high purity copper at relatively low deposition temperatures. In an MOCVD apparatus, several types of delivery systems can be used for transporting the copper precursor to the chemical vapor deposition reaction chamber depending upon whether the copper precursor is a solid or a liquid at room temperature. Solid precursors require a sublimation system to transport a sublimed vapor of the solid precursor to the deposition system. In the case where the precursor is a liquid, a bubbler system is used to transport an entrained vapor to the deposition chamber. Hydrogen gas can be used in the delivery system, so long as the temperature of the delivery system is not excessive. Both copper (I), and copper (II) $\beta$-diketonate precursors readily undergo decomposition in the presence of hydrogen at temperatures ranging from 150°–400° C.

In a preferred embodiment, the copper deposition is carried out using the Cu(I) precursor, copper hexafluoroacetylacetonate vinyltrimethylsilane (Cu(hfac)VTMS). To effect the deposition, the Cu(hfac)VTMS is maintained in a liquid container at 40° C. and hydrogen is bubbled through the liquid. Preferably, the hydrogen carrier gas flow rate is maintained at about 100–200 sccm, and most preferably at about 140 sccm. In addition, a small amount of water vapor is introduced to the precursor flow downstream from the liquid bubbler. The water vapor functions to increase the copper deposition rate at the susceptor. In the embodiment described herein, the addition of water vapor is an optional processing step which may be omitted when practicing the present invention. Preferably, the water vapor is maintained at a partial pressure of about 5–15 millitorr, and most preferably at about 11 millitorr. The copper is preferably deposited in a cold wall deposition system having a susceptor, which is maintained at a temperature of about 190° C.

Additionally, it is also within the scope of the invention that other copper deposition techniques can be used. For example, copper can be deposited by conventional thermal chemical vapor deposition, plasma-assisted chemical vapor deposition, plasma-enhanced chemical vapor deposition, laser chemical vapor deposition, sputter deposition, electroplating, and the like.

Figure 4:
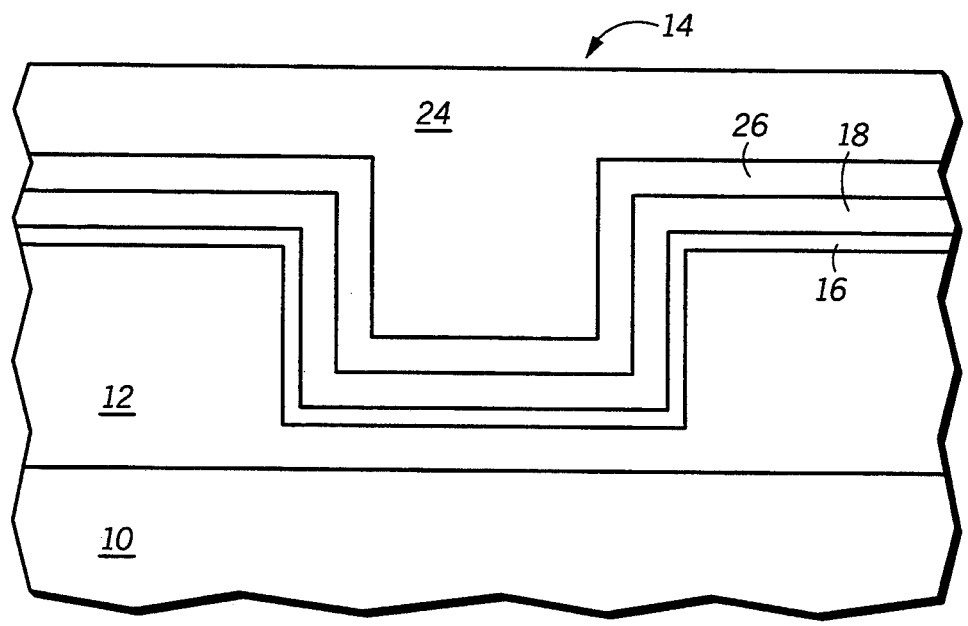

After the deposition of copper is complete, the inventive process continues with the annealing of substrate 10 to form a copper titanium (Cu—Ti) intermetallic layer 26, as illustrated in FIG. 4. Preferably, Cu—Ti intermetallic layer 26 is formed by annealing substrate 10 in a rapid thermal annealing apparatus. The rapid thermal annealing process is carried out at reduced pressure and at a temperature of about 500°–600° C. In one method, the annealing process is preferably carried out at a pressure of about 10–20 millitorr, and most preferably at about 15 millitorr. The annealing time will, of course, depend upon the exact annealing conditions employed. Within the previously described operating conditions, an annealing time of about 20 seconds is sufficient to form the Cu—Ti intermetallic layer. Alternatively, Cu—Ti intermetallic layer 26 can be formed by conventional thermal annealing in a forming gas ambient. In a conventional convection annealing process, substrate 10 is annealed at a temperature of about 400°–500° C. for a period of about 1 hour.

Copper titanium intermetallic layer 26 provides an adhesive body which adheres copper layer 24 to titanium nitride layer 18. Since copper does not adhere well to titanium nitride, in the absence of copper titanium intermetallic layer 26, copper layer 24 could peel or flake off of the underlying titanium nitride layer. A particular advantage of the present invention includes the interaction of titanium nitride layer 18 and copper layer 24 during the formation of copper titanium intermetallic layer 26. During the annealing process, copper and titanium undergo an interdiffusion process. In the absence of titanium nitride layer 18, copper could easily diffuse into underlying dielectric layer 12. However, titanium nitride layer 18 prevents the diffusion of copper to the underlying layers. Thus, the presence of titanium nitride layer 18 advantageously promotes the formation of an adhesive intermetallic layer by preventing diffusion of copper beyond the interface between titanium nitride layer 18 and intermetallic layer 26.

Figure 5:
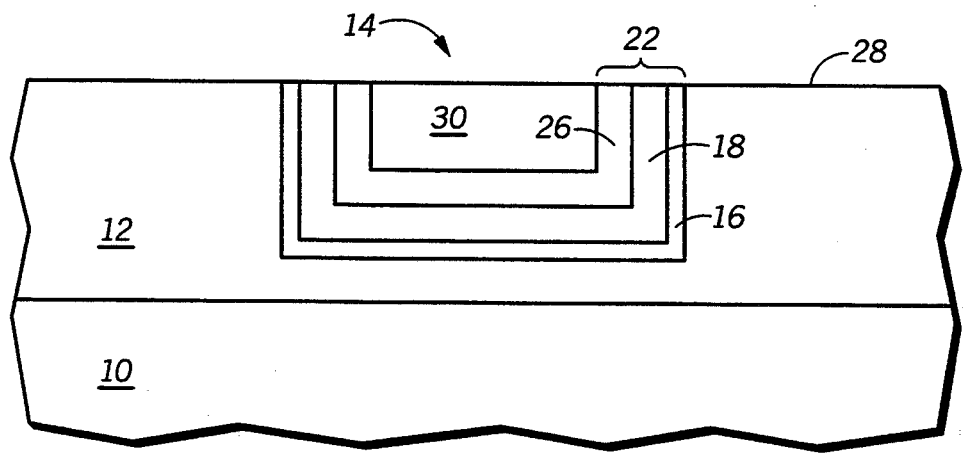

Following the formation of Cu—Ti intermetallic layer 26, substrate 10 is subjected to a planarization process which forms a planar surface 28, as illustrated in FIG. 5. To form planar surface 28, portions of copper layer 24 and interface layer 22 are non-selectively removed. Preferably, planar surface 28 is formed by chemical-mechanical-polishing (CMP), using a non-selective slurry composition. The slurry composition contains a silica abrasive material, which removes the different metal layers at substantially the same rate. Alternatively, planar surface 28 can be formed by a non-selective plasma etching process. The plasma etching process may include additional planarizing layers deposited onto copper layer 24. For example, a layer of photoresist can be deposited onto copper layer 24 prior to performing the non-selective etch process.

Upon completion of the non-selective removal process and the formation of planar surface 28, an inlaid copper interconnect 30 remains within a central portion of cavity 14 and imbedded within interface layer 22. Only a portion of copper interconnect 30 is illustrated in FIG. 5. As previously described, copper interconnect 30 can be configured to electrically couple various device components within an integrated circuit. As commonly practiced in integrated circuit design, interconnect layers are routed to all portions of an integrated circuit device, and may also be present in multiple layers overlying various device components. Although copper interconnect 30 is illustrated as residing in one defined layer, it is to be understood that other such copper interconnect layers and interface layers can be formed in subsequently deposited dielectric layers overlying copper interconnect 30.

The copper interconnect, formed in accordance with the invention, has a resistivity ranging from 2.0 to 3.0 $\mu$ohms-centimeters. The low electrical resistance of the copper interconnect indicates that only a small amount of copper is interdiffused with titanium during the annealing process, which forms copper titanium intermetallic layer 26. The regulation of the deposited thickness of second titanium layer 20, together with the aforementioned annealing conditions, combine to provide good adhesion of copper interconnect 30, while minimizing the extent of titanium and copper interdiffusion. It is important that excess titanium interdiffusion be minimized to maintain optimum electrical conductivity of copper interconnect 30. The annealing process of the invention, therefore enables a highly controlled interdiffusion of metal constituents during the formation of the intermetallic layer. The presence of the underlying titanium nitride layer 18 insures that copper, participating in the interdiffusion during the annealing process, will not further diffuse into underlying dielectric layers.

Figure 6:
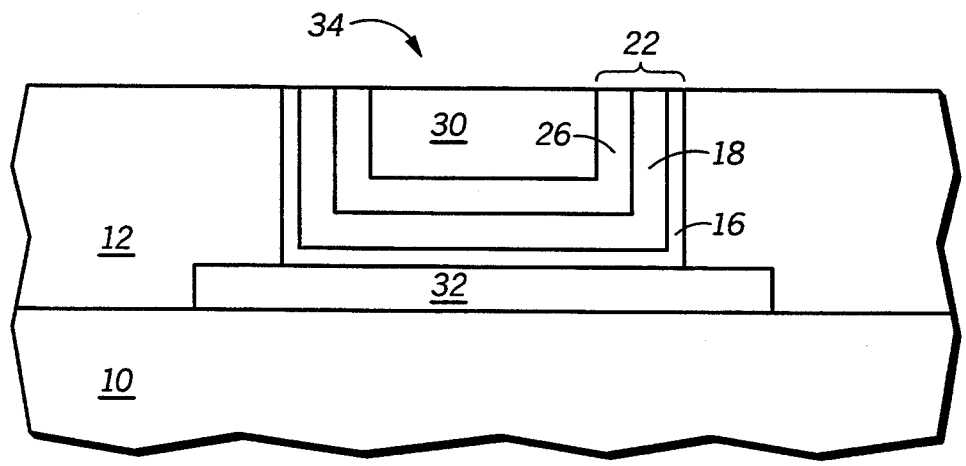
FIG. 6 illustrates, in cross-section, a via plug formed in accordance with a further embodiment of the invention.

The particular combination of metal layers and processing steps described in the foregoing embodiment results in the formation of a copper interconnect which can be utilized in a variety of integrated circuit structures. One example of the utilization of the copper interconnect structure and process of the invention is illustrated in FIG. 6. In the further embodiment of the invention illustrated in FIG. 6, a via structure has been formed in which the inlaid copper interconnect 30 forms a via plug. In this embodiment, an opening is formed in dielectric layer 12 which exposes a portion of a buried interconnect layer 32. Interface layer 22 is formed in accordance with the previously described processing steps and directly overlies the exposed portion of buried interconnect layer 32. Following the previously described planarization process, a via plug 34 extends from planar surface 28 to buried interconnect layer 32. Via plug 34 enables a subsequently deposited conductive layer to be electrically coupled to buried interconnect layer 32 through copper interconnect 30 and interface layer 22. Buried interconnect layer 32 can be one of a number of different metals commonly used in integrated circuit fabrication. For example, buried interconnect layer 32 can be aluminum, copper, an aluminum-silicon alloy, an aluminum-copper-silicon alloy, and the like.

Those skilled in the art will appreciate that via plug 34 can also contact a silicon substrate exposed through an opening formed in dielectric layer 12. In this case, via plug 34 would electrically couple a portion of a silicon substrate to a conductive layer overlying dielectric layer 12. In addition, the substrate region contacted by via plug 34 can be a silicided region in the substrate. The silicided region can be formed by depositing a refractory metal, such as titanium, onto the substrate and heating to form a silicide.

Thus it is apparent that there has been provided, in accordance with the invention, a copper interconnect structure and process which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the copper can be alloyed with other metals to improve resistance to corrosion, or to improve deposition characteristics, and the like. It is therefore intended to include within the invention all such variations and modifications as fall within the scope of the appended claims and equivalents thereof.

We claim:

1. A process for fabricating a semiconductor device comprising the steps of:
   providing a device substrate having a dielectric layer thereon;
   forming an interface layer overlying the dielectric layer, wherein the interface layer includes at least a diffusion barrier layer and a refractory metal adhesion layer overlying the barrier layer;
   forming a copper layer overlying the interface layer; and
   annealing the substrate to form an intermetallic layer between the copper layer and the interface layer, wherein the copper layer is in intimate contact with intermetallic layer.

2. A process for fabricating a semiconductor device comprising the steps of:
   providing a device substrate having a dielectric layer thereon;
   forming an interface layer overlying the dielectric layer, wherein the interface layer includes at least a diffusion barrier layer and an adhesion layer, wherein the adhesion layer comprises first and second titanium layers, and the diffusion barrier layer comprises a titanium nitride layer intermediate to the first and second titanium layers; and
   forming a copper layer overlying the interface layer; and
   annealing the substrate to form an intermetallic layer between the copper layer and the interface layer, wherein the copper layer is in intimate contact with intermetallic layer.

3. The process of claim 2, wherein the second titanium layer overlies the titanium nitride layer and is deposited to a thickness of 10 to 20 nanometers.

4. The process of claim 1, wherein the step of annealing the substrate comprises rapid thermal annealing at less than atmospheric pressure.

5. The process of claim 4, wherein the rapid thermal annealing is performed at a system pressure of 10 to 20 millitorr.

6. The process of claim 1, wherein the step of forming a copper layer comprises metal-organic-chemical-vapor-deposition of copper using a copper β-diketonate precursor.

7. A process for fabricating a semiconductor device comprising the steps of:
   providing a device substrate having a dielectric layer thereon;
   forming a cavity in the dielectric layer;
   forming an interface layer overlying the dielectric layer and the cavity, wherein the interface layer includes at least a titanium nitride layer and a titanium layer;
   forming a copper layer overlying and in intimate contact with the interface layer and filling the cavity;
   annealing the substrate to form a copper-titanium intermetallic layer between the copper layer and the interface layer; and
   removing portions of the copper layer, the intermetallic layer, and the interface layer overlying the dielectric layer to form a smooth surface.

8. The process of claim 7, wherein the step of removing comprises chemical-mechanical-polishing using a non-selective slurry.

9. The process of claim 7, wherein the step of forming a cavity comprises reactive ion etching of the dielectric layer.

10. The process of claim 7, wherein the step of forming a copper layer comprises metal-organic-chemical-vapor deposition of copper using a copper β-diketonate precursor.

11. The process of claim 7, wherein the step of annealing the substrate comprises rapid thermal annealing at less than atmospheric pressure.

12. The process of claim 7, wherein the interface layer comprises first and second titanium layers, and a titanium nitride layer intermediate to the first and second titanium layers.

13. A process for fabricating a semiconductor device comprising the steps of:
   providing a device substrate having a dielectric layer overlying a metal interconnect layer;
   forming an opening in the dielectric layer to expose a portion of the metal interconnect layer;
   forming an interface layer overlying the dielectric layer and the exposed metal interconnect layer, wherein the interface layer includes at least a titanium nitride layer and a titanium layer;
   forming a copper layer overlying and in intimate contact with the interface layer and filling the opening;
   annealing the substrate to form a copper-titanium intermetallic layer between the copper layer and the interface layer; and
   removing portions of the copper layer, the intermetallic layer, and the interface layer overlying the dielectric layer to form a smooth surface.

14. The process of claim 13, wherein the interface layer comprises first and second titanium layers, and a titanium nitride layer intermediate to the first and second titanium layers.

15. The process of claim 13, wherein the step of removing comprises chemical-mechanical-polishing using a non-selective slurry.

* * * * *